United States Patent
Saito et al.

(10) Patent No.: US 6,835,696 B2
(45) Date of Patent: Dec. 28, 2004

(54) METHOD OF FORMING A SUPERCONDUCTOR FILM

(75) Inventors: Atsushi Saito, Tokyo (JP); Akira Kawakami, Tokyo (JP); Hisashi Shimakage, Tokyo (JP); Zhen Wang, Tokyo (JP)

(73) Assignee: Communications Research Laboratory Independent Administrative Institute, Tokyo (JP)

( * ) Notice: Subject to any disclaimer, the term of this patent is extended or adjusted under 35 U.S.C. 154(b) by 26 days.

(21) Appl. No.: 10/235,788

(22) Filed: Sep. 6, 2002

(65) Prior Publication Data

US 2003/0096711 A1 May 22, 2003

(30) Foreign Application Priority Data

Nov. 22, 2001 (JP) .......................................... 2001-356802

(51) Int. Cl.[7] .............................................. C23C 14/34
(52) U.S. Cl. ....................... 505/475; 505/476; 505/470; 204/192.24
(58) Field of Search ...................... 204/192.24; 505/470, 505/475, 476

(56) References Cited

U.S. PATENT DOCUMENTS 4,629,547 A * 12/1986 Honda et al. .......... 204/192.15
6,626,995 B2 * 9/2003 Kim et al. ................... 117/101

OTHER PUBLICATIONS

Atsushi Saito, et al., "Fabrication of Josephson Junctions As–Grown $MgB_2$ Thin Films," The Japan Society of Applied Physics, No. 49, Mar., 2002, Abstract 28a–ZB–3.

Atsushi Saito, et al., "Low Temperature Fabrication of As–Grown $MgB_2$ Thin Films by Carrousel–Type Sputtering Apparatus", The Japan Society of Applied Physic, No. 62, Sep. 12, 2002, Abstract 12p–M–9.

Jun Nagamatsu, et al., "Superconductivity at 39K in Magnesium Diboride," Nature, vol. 410, p63–64, Mar. 2001.

Dave H. Blank, et al., "Superconducting Mg–B Films by Pulsed–Laser Deposition in an In Situ Two–Step Process Using Multicomponent Targets," Applied Physics Letters, vol. 79, No. 3, Jul. 16, 2001, pp 394–396.

(List continued on next page.)

Primary Examiner—Rodney G. McDonald

(57) ABSTRACT

The present invention provides methods forming the superconductor of as-grown film of $MgB_2$ which is made with magnesium and boron ejected from a magnesium target and a boron target, respectively, each in simultaneously sputtering process. The as-grown film composed of a compound of magnesium and boron is a superconductor without being annealed. The present invention can be applied to fabricate an integrated circuit of superconductor film, because the high temperature annealing process for the as-grown film of $MgB_2$ is unnecessary.

12 Claims, 6 Drawing Sheets

APPARATUS OF THE EMBODIMENT 1
OF THE PRESENT INVENTION

OTHER PUBLICATIONS

S.R. Shinde, et al., "Superconducting MgB2 Thin Films by Pulsed Laser Deposition," Applied Physics Letters, vol. 79, No. 2, Jul. 9, 2001, pp 227–229.

Atsushi Saito, et al., "As–Grown Deposition of Superconducting $MgB_2$ Thin Films by Multiple–Target Sputtering System", (1) Jpn.J.Appl.Phys.vol. 41 (2002)pp. L127–129 Part 2, No. 2A, Feb. 1, 2002, Atsushi Saito, et al., "As–Grown Deposition of $MgB_2$ Thin Film and Fabrication of Josephson Junctions", The Institute of Electronics, Information and Communication Engineers, Technical Report of IEICE.SCE2002–2, MW2002–2 (200–04).

Atsushi Saito, et al., "As–Grown $MgB_2$ Thin Films Deposited On $Al_2O_3$ Substrates With Different Crystal Plane," International Conference on Electronics Materials, Jun. 12, 2002, Abstract.

Atsushi Saito, et al., "As–Grown $MgB_2$ Thin Film Deposited On $Al_2O_3$ Substrates With Different Crystal Plane," Super Conductor Science and Technology 15 (2002) 1–5, Received Jun. 24, 2002.

Atsushi Saito, et al., "Fabrication of Josephson Junctions As–Grown $MgB_2$ Thin Films," Applied Superconductivity Conference Aug. 8, 2002 Abstract (4EG11).

* cited by examiner

APPARATUS OF THE EMBODIMENT 1 OF THE PRESENT INVENTION

EXAMPLE OF RESISTANCE-TEMPERATURE CHARACTERISTIC

OF A SUPERCONDUCTOR OF THE PRESENT INVENTION

RESISTANCE-TEMPERATURE CHARACTERISTICS
OF SUPERCONDUCTORS OF THE PRESENT INVENTION (a) 320°C (b) 350°C (c) 380°C

CRITICAL TEMPERATURE AND RESIDUAL RESISTANCE RATIO TO SUBSTRATE TEMPERATURE OF SUPERCONDUCTORS MADE BY THE PRESENT INVENTION

RESITANCE-TEMPERATURE CHARACTERISTICS
OF SUPERCONDUCTORS OF THE PRESENT INVENTION (a)

(b)

METHOD OF FORMING A SUPERCONDUCTOR FILM

CROSS REFERENCE TO RELATED APPLICATIONS

This application claims priority to Japanese Patent Application No. 2001-356802, filed Nov. 22, 2001 in Japan, the contents of which are incorporated herein by reference.

BACKGROUND OF THE INVENTION

1. Field of the Invention

The present invention relates to a method of forming a superconductor film composed of a compound of magnesium (Mg) and boron (B). More specifically, the ]present invention relates to a method of forming an as-grown film having a high critical temperature superconductor without being annealed.

2. Description of the Related Art

A $MgB_2$ compound features one of the highest transition temperatures of any superconductor. Additionally, a $MgB_2$ film can be integrated on a substrate to form an integrated circuit. Thus, the $MgB_2$ compound is expected to apply to electronics devices such as thin film devices.

It is reported that the coherent length $\xi(0)$ of $MgB_2$ is 54, and the magnetic penetration depth is 140–180 nm. One well known method of making the superconductor of $MgB_2$ is to form a bulk of $MgB_2$ by compression molding of powder of mono-crystal $MgB_2$, and then annealing the bulk at a high temperature. Another method of forming the superconductor of $MgB_2$ is to form a thin film of a $MgB_2$ compound by using PLD (pulse laser deposition), and then annealing the thin film of $MgB_2$ in the temperature range of 600° C.–1200° C. to make the film superconductive. The PLD method focuses a pulsed laser beam on a boron target to evaporate boron atoms and deposit the boron atoms on a substrate. The boron atoms on the substrate then react with magnesium atoms in high temperature magnesium vapor to form a $MgB_2$ film on the substrate. Further, the film is annealed at a high temperature, so as to become a superconductor. Another method of forming the superconductor film of a $MgB_2$ compound by using PLD is that which deposits magnesium and boron atoms on a substrate by laser deposition, and sets the substrate in magnesium vapor. The magnesium and boron on the substrate react in the magnesium vapor to form a thin film of the $MgB_2$ compound on the substrate. Annealing the $MgB_2$ film at a high temperature enables the film to have the features of a superconductor.

All prior art regarding fabrication of the superconductor of the $MgB_2$ compound requires high temperature annealing, in the range of 600° C.–1200° C. The necessity of the annealing process of the $MgB_2$ film to produce features of a superconductor makes fabrication of a device such as a thin film integrated circuit on a substrate difficult. Further, it has not been known that an as-grown film of $MgB_2$ on a substrate which is made by simultaneous magnesium and boron sputtering, using a sputtering apparatus, has characteristics of a superconductor without annealing the as-grown film.

SUMMARY OF THE INVENTION

The present invention features a method of forming a superconductor film of $MgB_2$ without annealing the as-grown film.

The present invention provides a method of forming an as-grown film of a superconductor composed of the $MgB_2$ compound made with magnesium and boron ejected from a magnesium target and a boron target, respectively, in a simultaneous sputtering process. The as-grown film composed of the compound of magnesium and boron can be a superconductor without being annealed. The as-grown film can be composed of a $MgB_2$ compound, or the film can be composed of one or more compounds of magnesium and boron different from the $MgB_2$ compound, or a magnesium element and a boron element in addition to the $MgB_2$ compound.

As mentioned above, a superconductor film of $MgB_2$ made using the present invention has features of a superconductor without being annealed, and its critical temperature is in the range of about 6K–29K. The present invention can be applied to fabricate an integrated circuit of a superconductor film, because the high temperature annealing process is not needed to make the as-grown film of the $MgB_2$ compound having features of a superconductor.

The objects, advantages and features of the present invention will be more clearly understood by referencing the following detailed disclosure and the accompanying drawings.

DETAILED DESCRIPTION OF THE PREFERRED EMBODIMENTS

Figure 1:
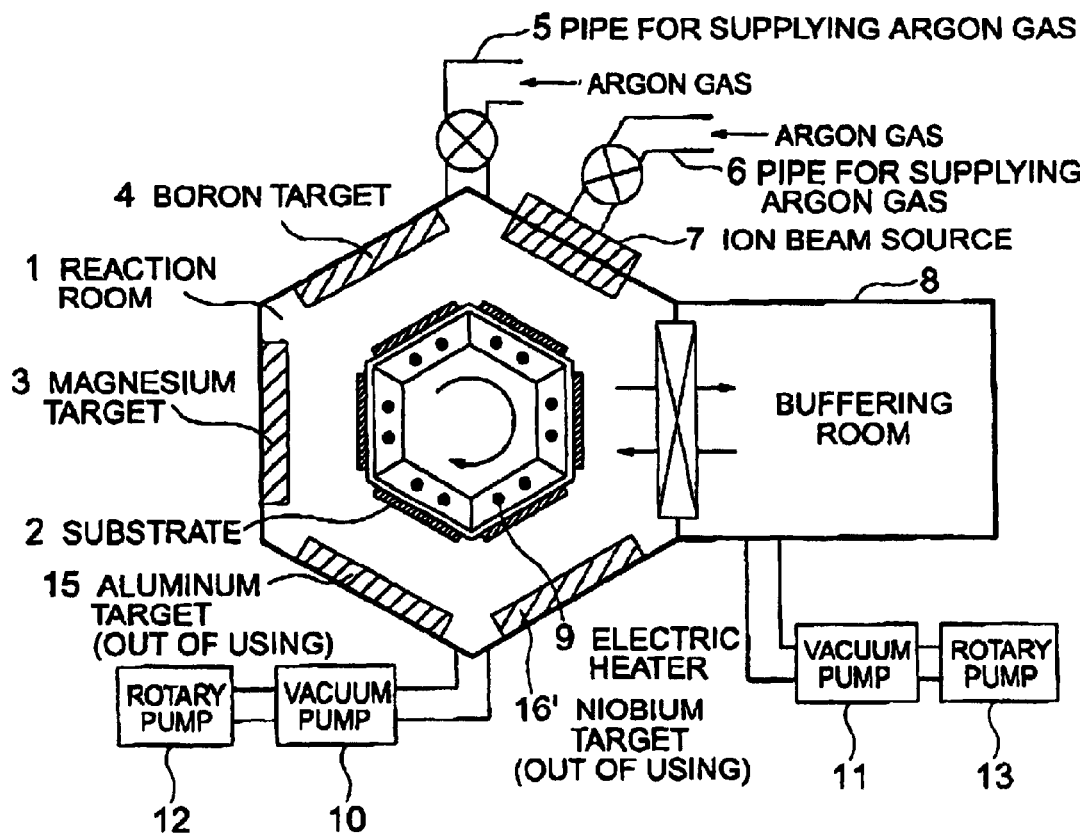
FIG. 1 shows a sputtering apparatus to implement the first embodiment of the present invention.

FIG. 1 shows a plan view of an apparatus to implement the present invention, that is a Carrousel-type sputtering apparatus for implementing the present invention. As shown in FIG. 1, the apparatus is composed of a reaction room 1, pipes 5 and 6 for supplying argon gas, an ion beam source 7, a buffering room 8, electric heaters 9 which are lamp heaters for heating substrates 2, vacuum pumps 10 and 11, and rotary pumps 12 and 13.

Substrates 2, on which the superconductor is formed, are set vertically to the plan view, on a holder. The holder is a hexagonal cylinder of six surfaces on which the substrates 2 are arranged. The cylinder rotates around an axis. The substrates 2 are, for example, $Al_2O_3$, MgO, $SiO_2$, etc. A magnesium target 3 of purity of 99.9%, a boron target 4 of purity of 99.5%, an aluminum target 15, and a niobium target 16' are set vertically to the plan view on the wall of the reaction room 1. Each target is faced to one of the substrates 2. The aluminum target 15 and the niobium target 16' are not used for forming a $MgB_2$ film. The ion beam source 7 generates argon ions and the ions are irradiated to the substrates 2 to clean their surfaces.

The reaction room 1 is exhausted to vacuum by the vacuum pumps 10 and 11 and the rotary pumps 12 and 13. Further, argon gas fills in the reaction room 1. High voltage is applied between the magnesium target 3 and the substrate 2, and between the boron target 4 and the substrate 2. DC voltage is applied between the magnesium target 3 and the substrate 2 so that the magnesium target 3 is positive voltage. AC voltage is applied between the boron target 4 and the substrate 2. The argon gas is discharged between the target and the substrate of each target and substrate pair. The gas discharges can be run simultaneously at each target and substrate pair, and each of the discharges can be controlled independently. During the discharge, the substrates 2 are heated by the electric heaters 9.

The discharge between the magnesium target 3 and the substrate 2 is DC discharge, applying positive DC voltage to the magnesium target 3. The discharge between the boron target 4 and the substrate 2 is high frequency discharge, thus applying high frequency alternating voltage between the boron target 4 and the substrate 2. The argon gas is discharged between the magnesium target 3 and the substrate 2, and between the boron target 4 and the substrate 2. The argon ions generated during the discharge result in ion bombardments to the magnesium target 3 and the boron target 4. As a result of the bombardments, atoms or ions of magnesium and atoms or ions of boron are ejected from each target, respectively, when the argon atoms or ions impact the targets. The magnesium atoms or ions and the boron atoms or ions react with each other in the reaction room 1 to produce compounds of magnesium and boron. The compound of magnesium and boron is then deposited on the substrates 2, which rotate in a plane vertical to the plan view around an axis with high speed. Alternatively, the magnesium atoms or ions and the boron atoms or ions are deposited on the substrates 2, and they react on the substrates 2 to produce the compound of magnesium and boron. In the explanation that follows, the sputtering process in simultaneous ion bombardments to the magnesium target and the boron target is called simultaneous magnesium and boron sputtering.

The as-grown film formed by the above mentioned method is usually polycrystalline, which is composed of only $MgB_2$, or composed of the $MgB_2$ compound and one or more than one of a magnesium element, a boron element, or compounds of magnesium and boron different from $MgB_2$. The film made by the present invention is usually composed of the components mentioned above. However, for the purpose of clarity, the present invention will be explained by a film composed of only a $MgB_2$ compound.

The substrates which are used in this embodiment of the present invention are $Al_2O_3$, MgO, or $SiO_2$. The temperature of each substrate is in the range of 250° C.–400° C. in the as-grown film forming process. The purity of argon gas is 99.9999%. The reaction pressure is in the range of 2–5 mTorr. The rotation speed of the substrates is 50 rpm. The input power for the discharge between the boron target and the substrate is high frequency AC power of 800 W. The input power for the discharge between the magnesium target and the substrate is DC power of 300 W. The reaction time to form the film is 10–60 minutes.

Figure 2:
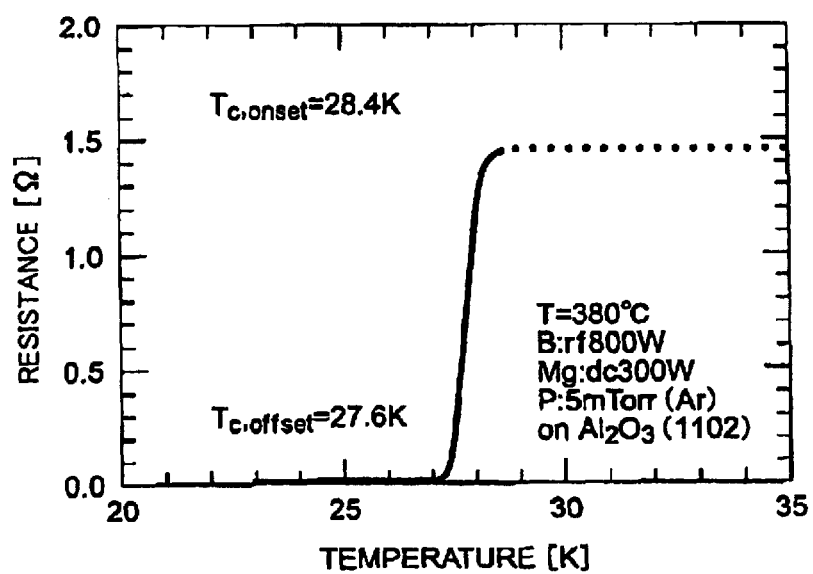
FIG. 2 shows an example 1 of resistance-temperature characteristics of a superconductor made by the present invention.

FIG. 2 shows resistance-temperature characteristics of the $MgB_2$ film made by the simultaneous magnesium and boron spattering using the Carrousel-type sputtering apparatus shown in FIG. 1. The substrate of the experiment is $Al_2O_3$ (1102). The film forming conditions are the substrate temperature being 380° C., the input power for discharging the gas between the boron target and the substrate being AC power of 800W, the input power of the discharge between the magnesium target and the substrate being DC power of 300W, and the reaction pressure being 5 mTorr (argon gas pressure). Under the above mentioned conditions, an as-grown film of $MgB_2$ is formed on the substrate, and the film has features of a superconductor without being annealed. The resistance-temperature characteristics are shown in FIG. 2. The critical temperature Tc is about 28 K, which shows that the film is superconductive at a high temperature.

Figure 3:
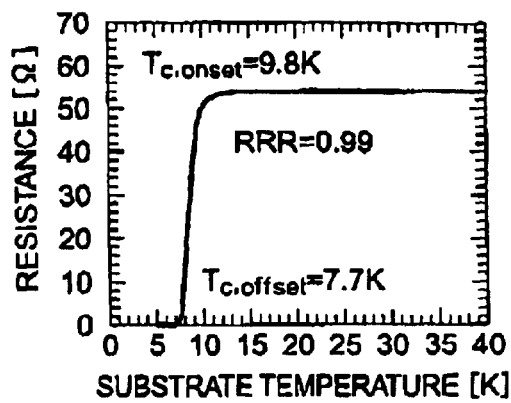
FIG. 3A shows temperature dependence of resistance-temperature characteristics of a superconductor made by the present invention, where the substrate temperature is 320° C.
FIG. 3B shows temperature dependence of resistance-temperature characteristics of a superconductor made by the present invention, where the substrate temperature is 350° C.
FIG. 3C shows temperature dependence of resistance-temperature characteristics of a superconductor made by the present invention, where the substrate temperature is 380° C.
Figure 3:
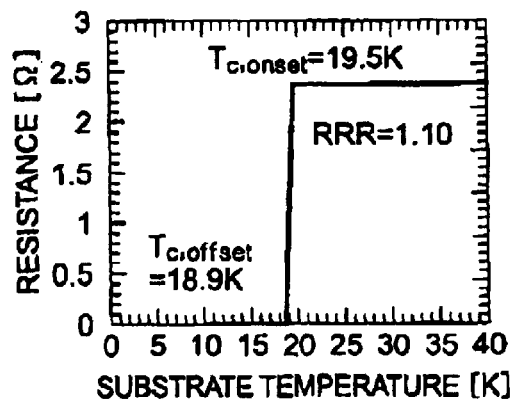
Figure 3:
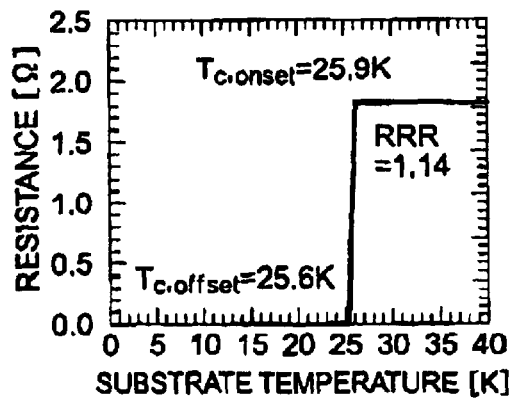

FIGS. 3A, 3B, and 3C show the temperature dependence of the resistance-temperature characteristics. The resistance-temperature characteristics are measured at various temperatures as a parameter. FIGS. 3A, 3B, and 3C show the resistance-temperature characteristics at the substrate temperatures of 320° C., 350° C., and 380° C., respectively, without annealing the as-grown film. The films are formed during the simultaneous magnesium and boron sputtering by the Carrousel-type sputtering apparatus.

The substrate (1102) is $Al_2O_3$. The input power for the discharge between the boron target and the substrate is AC power of 800W, and the input power for the discharge between the magnesium target and the substrate is DC power of 300W. The reaction pressure is 2 mTorr (in argon gas). The as-grown films formed by the simultaneous magnesium and boron sputtering in the apparatus shown in FIG. 1 have features of a superconductor without being annealed. The RRR (Residual Resistance Ratio) is the resistance ratio at 300K and 40K, and shows the degree of film fineness as a superconductor. It is known that the greater the RRR of the film is, the less the specific resistance of the film is, and the nearer to metal the film is.

FIG. 3A shows a case in which the substrate temperature is 320° C. The figure shows that the $MgB_2$ film of critical temperature Tc of 9K and RRR=0.99 can be formed without being annealed. FIG. 3B shows a film formed on a substrate with a temperature of 350. This figure shows that an as-grown film of $MgB_2$ of critical temperature Tc 19K and RRR 1.10 can be formed without being annealed. FIG. 3C shows an as-grown film formed on a substrate that has a temperature of 380° C. This figure shows that the $MgB_2$ film of critical temperature Tc of 25.6K and RRR=1.14 can be formed without being annealed.

Figure 4:
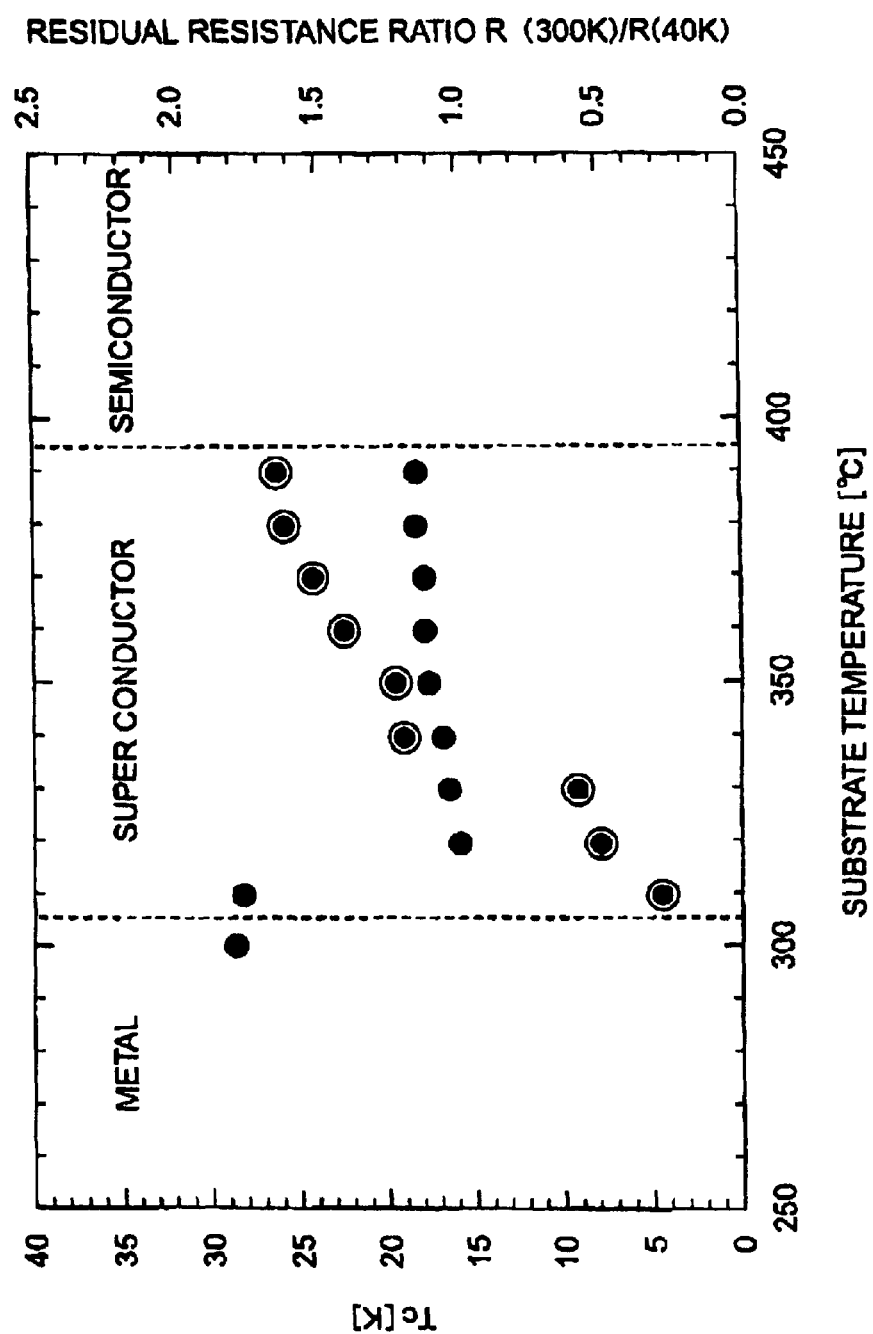
FIG. 4 shows temperature dependence of critical temperature and residual specific resistance of a superconductor made by the present invention.

FIG. 4 shows the dependence of critical temperature and residual resistance ratio of the film formed by the present invention on substrate temperature. Relations of the critical temperature and the residual resistance ratio to the substrate temperature are measured at various substrate temperatures to form the as-grown film of $MgB_2$. FIG. 4 shows the results. The condition to form the film is the same as the conditions set forth for FIGS. 3A, 3B and 3C. In FIG. 4, the circled black dots show the relationship between substrate temperature and critical temperature, the uncircled black dots show the relationship between residual resistance ratio and the substrate temperature. The critical temperature and the residual resistance ratio corresponding to the same substrate temperature are those of the MgB$_2$ film on the substrate. The film formed on a substrate that has a temperature lower than 300° C. shows features of metal and does not show features of a superconductor. In FIG. 4, the values of residual resistance ratio at 300° C. are higher than the values at another substrate temperature. This is believed to occur because of the high magnesium rate near the substrate. For films formed on a substrate that has a temperature between 320° C.–380° C. the high temperature superconductor feature of residual resistance ratio is 1.0–1.7.

As explained above, the as-grown film of MgB$_2$ formed on the rotating substrate facing to the magnesium target and the boron target in the simultaneous sputtering process, using Carrousel-type sputtering apparatus, has features of a high critical temperature superconductor without annealing the as-grown film. In the above mentioned embodiment of the present invention, the substrates are rotated with high speed, however, it has been found by the inventors of the present invention that an as-grown film of MgB$_2$ formed by the simultaneous sputtering process on a substrate kept static has features of a superconductor at a high temperature without annealing the as-grown film, similar to those of films formed on the rotating substrate with high speed in the simultaneous sputtering process.

Figure 5:
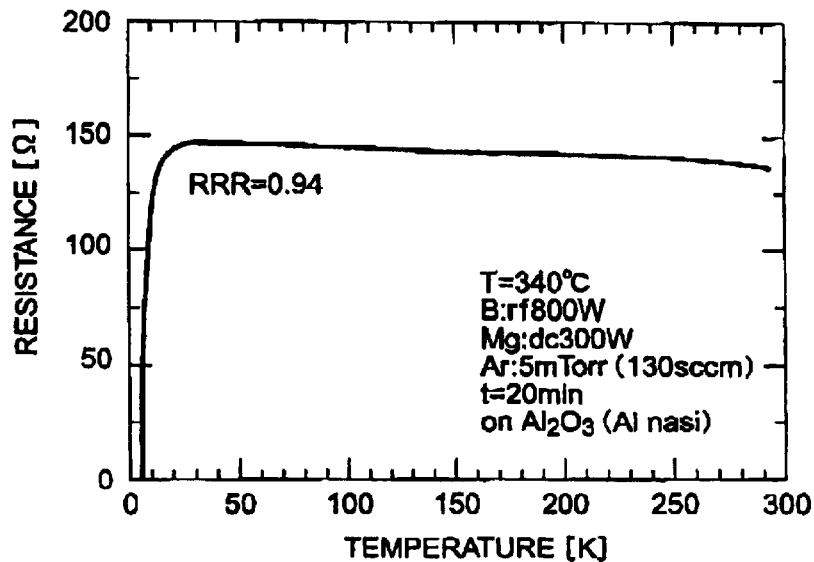
FIG. 5A shows resistance-temperature characteristics of a superconductor of example 2 made by the present invention using the sputtering apparatus shown in FIG. 1.
FIG. 5B shows resistance-temperature characteristics of a superconductor of example 2 made by the present invention using the sputtering apparatus shown in FIG. 1, where the axis of abscissas in FIG. 5B is enlarged and corresponds to the region of 0–50 K on the axis of abscissas in FIG. 5A.
Figure 5:
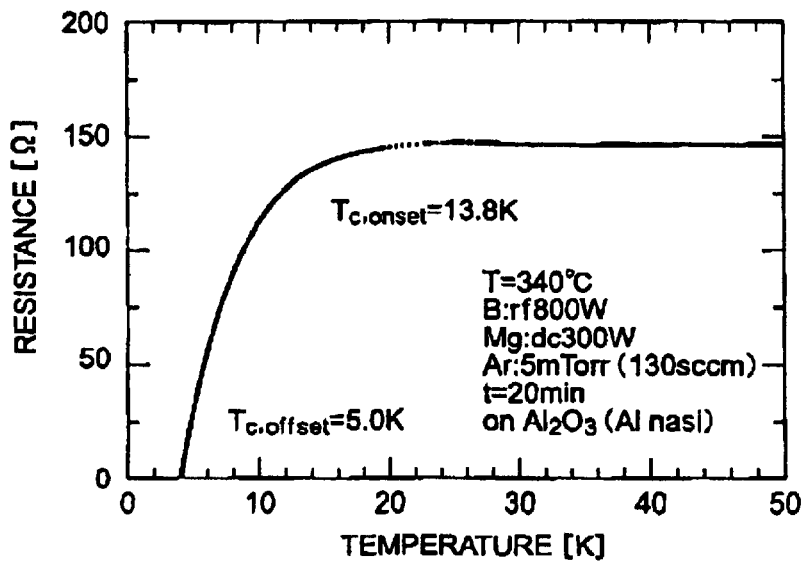

FIGS. 5A and 5B show resistance-temperature characteristics of MgB$_2$ film which is made by a second embodiment of the present invention method. The axis of abscissas in FIG. 5B is enlarged and corresponds to the region of 0–50 on the axis of abscissas in FIG. 5A. The as-grown film of MgB$_2$ made by method of the second embodiment of the present invention is formed on an immovable substrate, which is different from the method of embodiment 1 which uses rotating substrates. The resistance-temperature characteristics in FIGS. 5A and 5B are those of MgB$_2$ film formed on an immobile substrate 2, using the Carrousel-type simultaneous sputtering apparatus shown in FIG. 1.

A substrate 2 is located so as to face to the middle between the magnesium target 3 and boron target 4 in the Carrousel-type sputtering apparatus, and is fixed at the position. The substrate on which the MgB$_2$ film is formed is Al$_2$O$_3$ (1102). The conditions for forming an as-grown film of MgB$_2$ are a substrate temperature of 340° C. in the film forming process, the application of AC power of 800 W for the discharge between the magnesium target and the substrate, the application of DC power of 300 W for the discharge between the magnesium and the substrate, the reaction pressure of 5.0 mTorr in argon gas, and a reaction time of 20 minutes for forming the film. As shown in FIGS. 5A and 5B, the as-grown film of MgB$_2$ formed by the second embodiment of the present invention has features of the superconductor without annealing the as-grown film.

FIGS. 5A and 5B show that a film fabricated on the immobile substrate by simultaneous magnesium and boron sputtering has features of a superconductor. The film is fabricated by using Carrousel-type simultaneous sputtering apparatus in a mode in which its substrate holder is not rotated. However, the MgB$_2$ film of the present invention can be formed with a static-type simultaneous sputtering apparatus.

Figure 6:
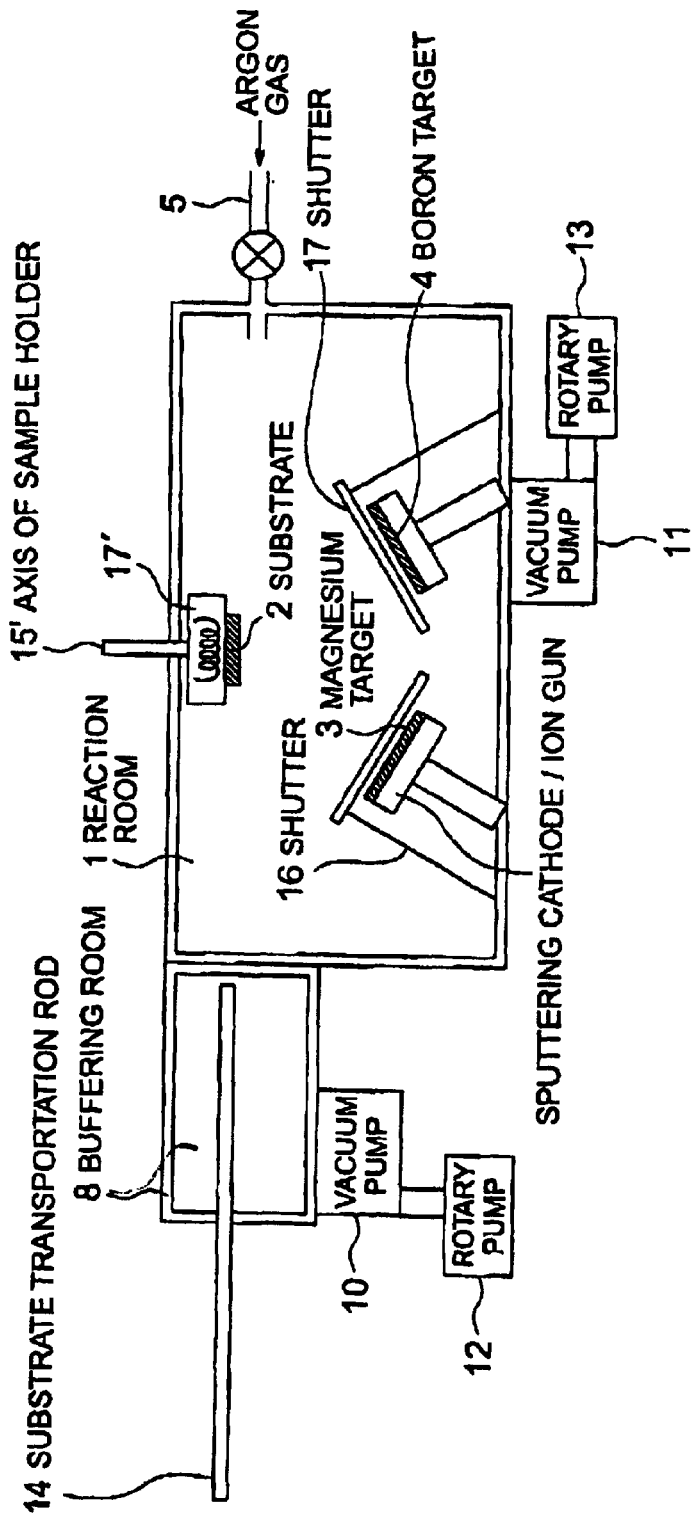
FIG. 6 shows a static-type sputtering apparatus for implementing the present invention.

FIG. 6 shows an outline of the static-type simultaneous sputtering apparatus. As shown in FIG. 6, the static-type spattering apparatus is composed of a reaction room 1, pipes 5 and 6 for supplying argon gas, ion beam source 7, buffering room 8, electric heaters 9 which are lamp heaters for heating substrates 2, vacuum pumps 10 and 11, rotary pumps 12 and 13, a substrate transportation rod 14, an axis of substrate holder 15' which rotates the substrate 2 in a horizontal plane, a shutter 16, 17 which controls a film thickness, blocking the flow of ejected magnesium or boron atoms or ions, and a heater 17' which heats the substrate 2.

The operation of the apparatus shown in FIG. 6 is explained as follows. Argon gas enters the reaction room 1. Positive DC voltage is applied between the substrate 2 and the magnesium target 3. High frequency AC voltage is applied between the boron target 4 and the substrate 2. Argon gas is then discharged between the magnesium target 3 and the substrate 2 and between the boron target 4 and the substrate 2, as a result of the applied voltage. The discharge between the substrate 2 and the magnesium target 3, and the discharge between the substrate 2 and the boron target 4 can be controlled independently in the simultaneous magnesium and boron sputtering process. While the simultaneous magnesium and boron sputtering occurs, the argon ions bombard the magnesium target 3 and the boron target 4 to eject magnesium atoms and boron atoms, respectively, from each target. The atoms or ions of the magnesium and boron react to each other in the reaction room 1 to produce molecules of a MgB$_2$ compound. The MgB$_2$ molecules and an as-grown film of MgB$_2$ are then deposited on the substrate. Alternatively, the atoms or ions of the magnesium or the boron ejected from each target, respectively, are deposited on the substrate and the magnesium element and the boron element and react to produce an as-grown film of MgB$_2$. The as-grown film has features of a superconductor without being annealed.

MgB$_2$ film formed by the method explained above is usually polycrystalline. However, a mono-crystalline or amorphous film of MgB$_2$ which is formed by the simultaneous magnesium and boron sputtering process has features of a superconductor without being annealed. Such films are involved in the scope of the present invention.

The many features and advantages of the present invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modification and equivalents falling within the scope of the invention may be included in the present invention.

What is claimed is:

1. A method of forming a superconductor film, comprising:

filling gas in a sealed container having therein a magnesium target, a boron target and one or more substrates facing the targets;

applying voltage between the magnesium target and the substrate to discharge the gas and between the boron target and the substrate to discharge the gas; and forming a film of a MgB$_2$ compound on the substrates, the MgB$_2$ compound generated from reaction of magnesium ejected in a sputtering process at the magnesium target and boron ejected in a sputtering process at the boron target, wherein the film is formed on the substrate with a temperature of 300° C.–390° C., and the film of the MgB$_2$ compound has characteristics of a superconductor as-grown film without being annealed once the film has been formed.

2. The method of forming a superconductor film as in claim 1,
wherein the film contains a compound of magnesium and boron stoichiometrically different from the $MgB_2$ compound, a magnesium element, or a boron element in addition to the $MgB_2$ compound.

3. The method of forming a superconductor film as in claim 1,
wherein the film is polycrystalline, mono-crystalline, or amorphous.

4. The method of forming a superconductor film as in claim 1,
wherein DC voltage is applied between the magnesium target and the substrate to discharge the gas, and AC voltage is applied between the boron target and the substrate to discharge the gas.

5. The method of forming a superconductor film as in claim 1,
wherein a critical temperature of the film is 19K–29K.

6. The method of forming a superconductor film as in claim 1,
wherein the substrate is static in the film forming.

7. The method of forming a superconductor film as in claim 2,
wherein the film is polycrystalline, mono-crystalline, or amorphous.

8. The method of forming a superconductor film as in claim 2,
wherein DC voltage is applied between the magnesium target and the substrate to discharge the gas, and AC voltage is applied between the boron target and the substrate to discharge the gas.

9. The method of forming a superconductor film as in claim 2,
wherein a critical temperature of the film is 19K–29K.

10. The method of forming a superconductor film as in claim 2,
wherein the substrate is static in the film forming.

11. The method of forming a superconductor film as in claim 1, wherein the magnesium target and the boron target are set separately in the sealed container.

12. The method of forming a superconductor film as in claim 1, wherein the container is a first polygonal cylinder and a second inner polygonal cylinder is set coaxial with the center axis of the first polygonal cylinder, the magnesium target and the boron target are placed on inside walls of the first polygonal cylinder, respectively, and substrates are placed on outside surfaces of the second inner polygonal cylinder.

* * * * *

UNITED STATES PATENT AND TRADEMARK OFFICE
CERTIFICATE OF CORRECTION

PATENT NO. : 6,835,696 B2
DATED : December 28, 2004
INVENTOR(S) : Atsushi Saito et al.

It is certified that error appears in the above-identified patent and that said Letters Patent is hereby corrected as shown below:

Title page,
Item [73], Assignee, change "Institute" to -- Institution --;
Item [56], References Cited, OTHER PUBLICATIONS, change
"Atsushi Saito, et al, "Low Temperature Fabrication of As-Grown $MgB_2$ Thin films by Carrousel- Type Sputtering Apparatus". The Japan Society of Applied Physic, No. 62, Sep 12, 2002, Abstract 12p-M-9." to
-- Atsushi Saito, et al, "Low Temperature Fabrication of As-Grown $MgB_2$ Thin films by Carrousel- Type Sputtering Apparatus". The Japan Society of Applied Physic, No. 62, Sep 12, 2001, Abstract 12p-M-9. --.
"Atsushi" 3rd reference, change "Feb. 1, 2002," to -- Feb. 1, 2002. --.

Column 6,
Line 63, change "C." to -- C -- (both occurrences).

Signed and Sealed this

Sixteenth Day of August, 2005

JON W. DUDAS
*Director of the United States Patent and Trademark Office*